(12) United States Patent
Bang

(10) Patent No.: US 10,847,548 B2
(45) Date of Patent: Nov. 24, 2020

(54) LED DISPLAY DEVICE HAVING TFT SUBSTRATE PROVIDED WITH LED DRIVER UNITS

(71) Applicant: LUMENS CO., LTD., Yongin-si (KR)

(72) Inventor: Jeongho Bang, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/178,608

(22) Filed: Nov. 2, 2018

(65) Prior Publication Data

US 2019/0148409 A1 May 16, 2019

(30) Foreign Application Priority Data

Nov. 10, 2017 (KR) .......................... 10-2017-0149107

(51) Int. Cl.

| | |
|---|---|
| *H01L 27/12* | (2006.01) |
| *G06F 3/041* | (2006.01) |
| *G09G 3/32* | (2016.01) |
| *H01L 23/367* | (2006.01) |
| *G02F 1/1333* | (2006.01) |
| *H01L 33/64* | (2010.01) |

(52) U.S. Cl.
CPC ........ *H01L 27/124* (2013.01); *G02F 1/13338* (2013.01); *G06F 3/041* (2013.01); *G09G 3/32* (2013.01); *H01L 23/367* (2013.01); *H01L 33/64* (2013.01); *G06F 2203/04103* (2013.01); *G09G 2300/0408* (2013.01); *G09G 2300/0426* (2013.01); *G09G 2300/0809* (2013.01)

(58) Field of Classification Search
CPC combination set(s) only.
See application file for complete search history.

(56) References Cited

U.S. PATENT DOCUMENTS

| | | | |
|---|---|---|---|
| 2012/0018745 A1 | 1/2012 | Liu et al. | |
| 2014/0354597 A1* | 12/2014 | Kitchens, II | .......... G06F 1/3215 345/175 |
| 2017/0047393 A1* | 2/2017 | Bower | .................... G06F 3/044 |
| 2017/0069611 A1 | 3/2017 | Zhang et al. | |
| 2017/0092892 A1 | 3/2017 | Zhang et al. | |
| 2017/0167703 A1 | 6/2017 | Cok | |
| 2017/0179192 A1* | 6/2017 | Zhang | .................... H01L 25/50 |

(Continued)

FOREIGN PATENT DOCUMENTS

| | | |
|---|---|---|
| JP | 2006-100796 A | 4/2006 |
| JP | 2007-293264 A | 11/2007 |
| JP | 2008-205985 A | 9/2008 |

(Continued)

*Primary Examiner* — Deeprose Subedi
(74) *Attorney, Agent, or Firm* — Mei & Mark LLP

(57) ABSTRACT

Disclosed is an LED display device using a TFT substrate provided with LED driver units. The LED display device includes a TFT substrate, LED chips, a light transmitting plate, and a heat dissipating plate. The TFT substrate includes a plurality of LED driver units arrayed in a matrix. Each of the LED driver units includes a plurality of transistors. The LED chips are attached to and driven by the corresponding LED driver units. The light transmitting plate is attached to the upper portions of the LED chips. Light emitted from the LED chips is transmitted through the light transmitting plate. The heat dissipating plate is attached to the TFT substrate to dissipate heat generated from the LED chips.

8 Claims, 13 Drawing Sheets

(56) References Cited

U.S. PATENT DOCUMENTS

2018/0123080 A1* 5/2018 Kim .................... H01L 27/322

FOREIGN PATENT DOCUMENTS

| JP | 2016-512347 A | 4/2016 |
| JP | 2016-189413 A | 11/2016 |
| JP | 2017-500757 A | 1/2017 |
| KR | 10-2011-0057552 A | 6/2011 |
| WO | 2011-016422 A1 | 2/2011 |

* cited by examiner

LED DISPLAY DEVICE HAVING TFT SUBSTRATE PROVIDED WITH LED DRIVER UNITS

BACKGROUND OF THE INVENTION

1. Field of the Invention

The present invention relates to an LED display device having a thin film transistor (TFT) substrate provided with LED driver units for individually driving sub-pixels, i.e. R, G, and B LED chips, in pixels. More specifically, the present invention relates to an LED display device using a TFT substrate mounted with constituent small-sized sub-pixels (i.e. R, G, and B LED chips) of pixels wherein the TFT substrate is provided with a plurality of LED driver units arrayed in a matrix by a TFT fabrication process and connected with the corresponding sub-pixels to individually drive the sub-pixels.

2. Description of the Related Art

In a general full-color LED display device, each pixel includes a red (R) LED, a green (G) LED, and a blue (B) LED, called "sub-pixels". The introduction of white LEDs in addition to red LEDs, green LEDs, and blue LEDs has been proposed recently.

Package-on-module and chip-on-module have been developed as techniques for forming pixels in the fabrication of LED display devices. According to the package-on-module technique, blue, green, and red LED packages are modularized and the modules are applied to LED display devices. However, this technique is difficult to apply to the fabrication of small-sized display devices due to the basic footprint of the modules and has difficulty in achieving high resolution of display devices. According to the chip-on-module technique, red, green, and blue LED chips are not packaged but are directly mounted on a substrate. The chip-on-module technique enables the miniaturization of display devices and is thus advantageous in terms of display resolution and color gamut compared to the package-on-module technique.

The two package techniques are mainly used to mount LED chips on printed circuit boards (PCBs) in the fabrication of full-color LED display devices with relatively high resolution. However, many technical difficulties are encountered when various types of chips, including driver circuits, are mounted on the rear surface of printed circuit boards and various types of lines are interconnected through vias, defective short or open circuiting between interconnection lines may occur frequently, and the thickness of printed circuit boards should be at or above a predetermined level. Thus, there is a need in the art to provide a solution to these difficulties.

SUMMARY OF THE INVENTION

The present invention has been made in an effort to solve problems encountered when LED chips are mounted on a printed circuit substrate in the fabrication of a full-color LED display device by a conventional method, that is, problems resulting from the basic thickness of a multilayer printed circuit board consisting of a plurality of layers that need to be electrically connected through vias and problems caused by frequent defective short or open circuiting between interconnection lines through vias, and intends to provide an LED display device using a TFT substrate provided with LED driver units including a plurality of thin film transistors (TFTs) and arrayed in a matrix.

One aspect of the present invention provides an LED display device including: a TFT substrate including a plurality of LED driver units arrayed in a matrix, each of the LED driver units including a plurality of transistors; LED chips attached to and driven by the corresponding LED driver units; a light transmitting plate attached to the upper portions of the LED chips and through which light emitted from the LED chips is transmitted; and a heat dissipating plate attached to the TFT substrate to dissipate heat generated from the LED chips.

According to one embodiment, each of the LED chips includes a first electrode facing the TFT substrate and a second electrode facing the light transmitting plate.

According to one embodiment, the TFT substrate includes electrode pads connected with the first electrodes to electrically connect the LED driver units and the corresponding LED chips.

According to one embodiment, the light transmitting plate includes light transmitting electrode patterns electrically connected with the second electrodes of the corresponding LED chips.

According to one embodiment, the TFT substrate includes second electrode common lines to which the second electrodes of the LED chips are connected in common.

According to one embodiment, the LED display device further includes conductors located between the light transmitting plate and the TFT substrate to electrically connect the second electrode common lines and the second electrodes of the LED chips.

According to one embodiment, the conductors are located outside arrays of the LED chips and the second electrode common lines are located outside arrays of the LED driver units.

According to one embodiment, the LED chips are grouped in threes that emit red, green, and blue light, and are adjacent to one another.

According to one embodiment, the LED display device further includes conductors, each of which is located between the light transmitting plate and the TFT substrate such that the second electrodes of the three LED chips in each pixel are electrically connected to the TFT substrate.

According to one embodiment, the light transmitting plate includes a patterned substrate including light transmitting electrode patterns electrically connected with the second electrodes of the LED chips, a polarizing film attached to the upper surface of the patterned substrate, and a touch film attached to the upper surface of the polarizing film.

According to one embodiment, the TFT substrate includes a plurality of voltage lines interconnected in a first direction parallel to the second electrode common lines on the LED driver units, a plurality of scan lines electrically insulated from the voltage lines and interconnected in a second direction crossing the first direction, and a plurality of data lines electrically insulated from the voltage lines and the scan lines and interconnected parallel to the voltage lines in the first direction.

According to one embodiment, each of the LED driver units includes a switching transistor, a driving transistor, and a storage capacitor; a gate terminal of the switching transistor is connected to the scan line and a drain terminal of the switching transistor is connected to the data line; a gate terminal of the driving transistor is connected to a source terminal of the switching transistor, a drain terminal of the driving transistor is connected to the voltage line, and a source terminal of the driving transistor is connected to the first electrode of the corresponding LED chip; the storage capacitor is connected between the gate terminal and the source terminal of the driving transistor; and the second electrode of the corresponding LED chip is connected to the second electrode common line through the conductor.

According to one embodiment, the LED display device further includes a plurality of data driver ICs arranged in the second direction at one side of the TFT substrate and corresponding to the data lines and a plurality of line driver ICs arranged in the first direction at the other side of the TFT substrate and corresponding to the scan lines.

According to one embodiment, the LED display device further includes global voltage lines, each of which is interconnected in the second direction at one side of the TFT substrate and to which the voltage lines are connected in common, global second electrode common lines interconnected parallel to the global voltage lines in the second direction and connected with the second voltage lines, and a time control unit connected to the global voltage lines and the global second electrode common lines.

According to one embodiment, the voltage lines include voltage line pairs, each of which includes a first voltage line and a second voltage line; and when the number of the scan lines is 2n, an LED operating voltage is supplied to the LED driver unit connected to the first scan line to the LED driver unit connected to the $n^{th}$ scan line through the first voltage line and an LED operating voltage is supplied to the LED driver unit connected to the $(n+1)^{th}$ scan line to the LED driver unit connected to the $2n^{th}$ scan line through the second voltage line.

According to one embodiment, each of the LED chips is a flip chip in which a first electrode and a second electrode face the TFT substrate.

According to one embodiment, the TFT substrate includes electrode pads connected with the first electrodes of the LED chips and electrode pads connected with the second electrodes of the LED chips such that the LED driver units are electrically connected with the corresponding LED chips.

According to one embodiment, the light transmitting plate includes a polarizing film attached to the upper portions of the LED chips and a touch film attached to the upper surface of the polarizing film.

According to one embodiment, the TFT substrate includes a plurality of voltage lines interconnected in a first direction on the LED driver units, a plurality of scan lines electrically insulated from the voltage lines and interconnected in a second direction crossing the first direction, and a plurality of data lines electrically insulated from the voltage lines and the scan lines and interconnected parallel to the voltage lines in the first direction.

According to one embodiment, the TFT substrate includes a plurality of second electrode common lines interconnected parallel to the plurality of voltage lines in the first direction.

According to one embodiment, the second electrode common lines are connected in common to the electrode pads connected with the second electrodes of the LED chips corresponding to the plurality of LED driver units connected to each of the voltage lines.

According to one embodiment, the LED display device further includes global voltage lines, each of which is interconnected in the second direction at one side of the TFT substrate and to which the voltage lines are connected in common, global second electrode common lines interconnected parallel to the global voltage lines in the second direction and to which the second electrode common lines are connected in common, and a time control unit connected with the global voltage lines and the global second electrode common lines.

According to one embodiment, the voltage lines include voltage line pairs, each of which includes a first voltage line and a second voltage line; and when the number of the scan lines is 2n, an LED operating voltage is supplied to the LED driver unit connected to the first scan line to the LED driver unit connected to the $n^{th}$ scan line through the first voltage line and an LED operating voltage is supplied to the LED driver unit connected to the $(n+1)^{th}$ scan line to the LED driver unit connected to the $2n^{th}$ scan line through the second voltage line.

According to one embodiment, the second electrode common lines and the voltage lines may have linewidths of 20 μm.

The LED display device of the present invention uses a TFT substrate provided with LED driver units arrayed in a matrix and connected with corresponding LED chips to individually drive the LED chips. Due to this construction, the LED display device of the present invention is effective in solving problems encountered when LED chips are mounted on a printed circuit substrate in the fabrication of a full-color LED display device by a conventional method, that is, problems resulting from the basic thickness of a multilayer printed circuit board consisting of a plurality of layers that need to be electrically connected through vias and problems caused by frequent defective short or open circuiting between interconnection lines through vias.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described with reference to the accompanying drawings. It should be noted that the drawings and embodiments are simplified and illustrated such that those skilled in the art can readily understand the present invention.

Figure 1:
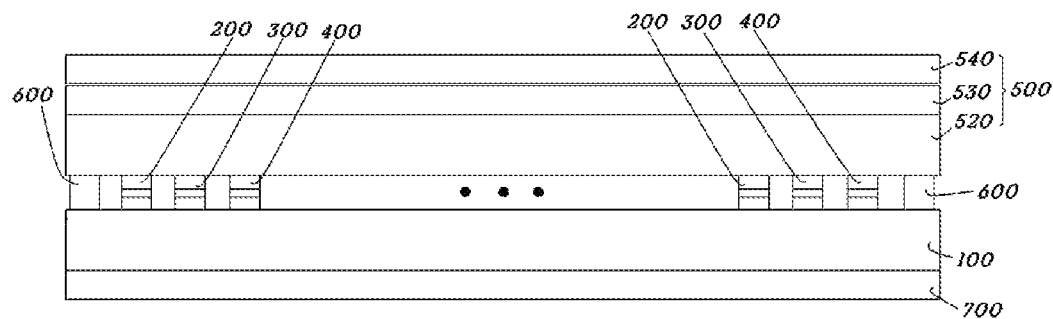
FIG. 1 illustrates a vertical structure of an LED display device according to one embodiment of the present invention.
Figure 2:
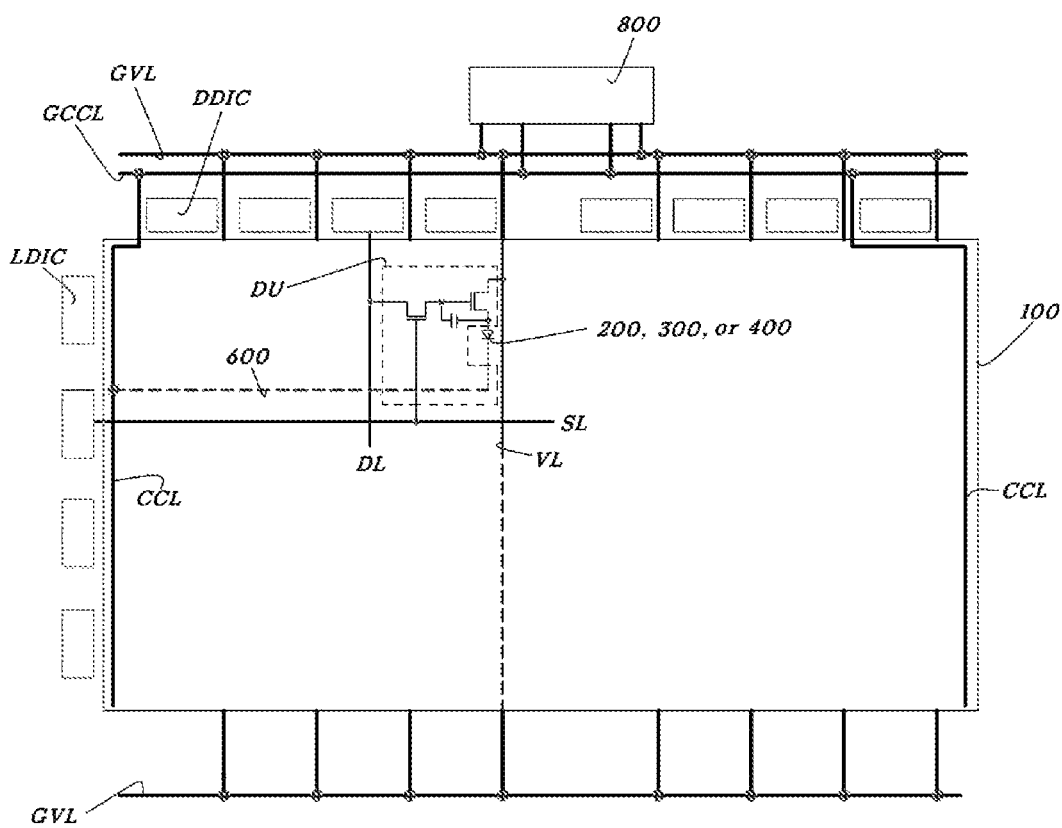
FIG. 2 illustrates a horizontal structure of the LED display device of FIG. 1.
Figure 3:
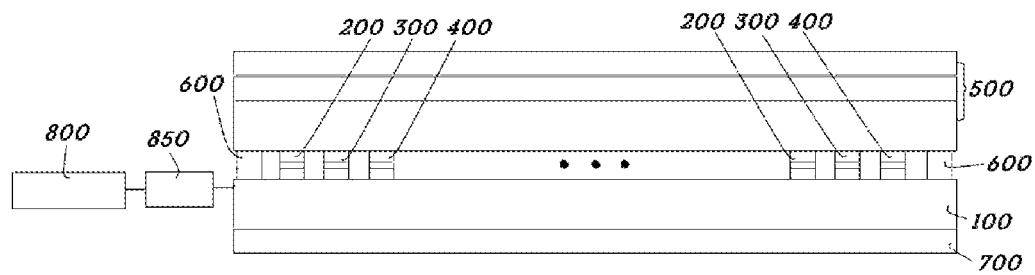
FIG. 3 illustrates a time control printed board assembly (PBA) and a data line printed board assembly (PBA) in the LED display device of FIG. 1.
Figure 4:
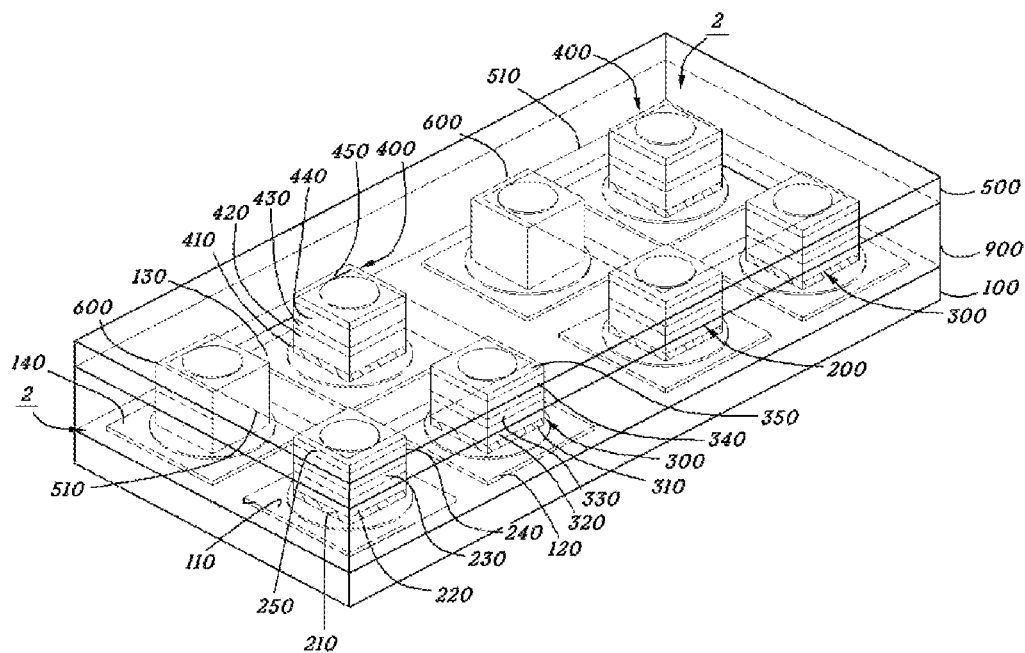
FIG. 4 illustrates an example of the LED display device of FIG. 1 in which each pixel includes three different types of LED chips (i.e. red, green, and blue light emitting LED chips) and one conductor.
Figure 5:
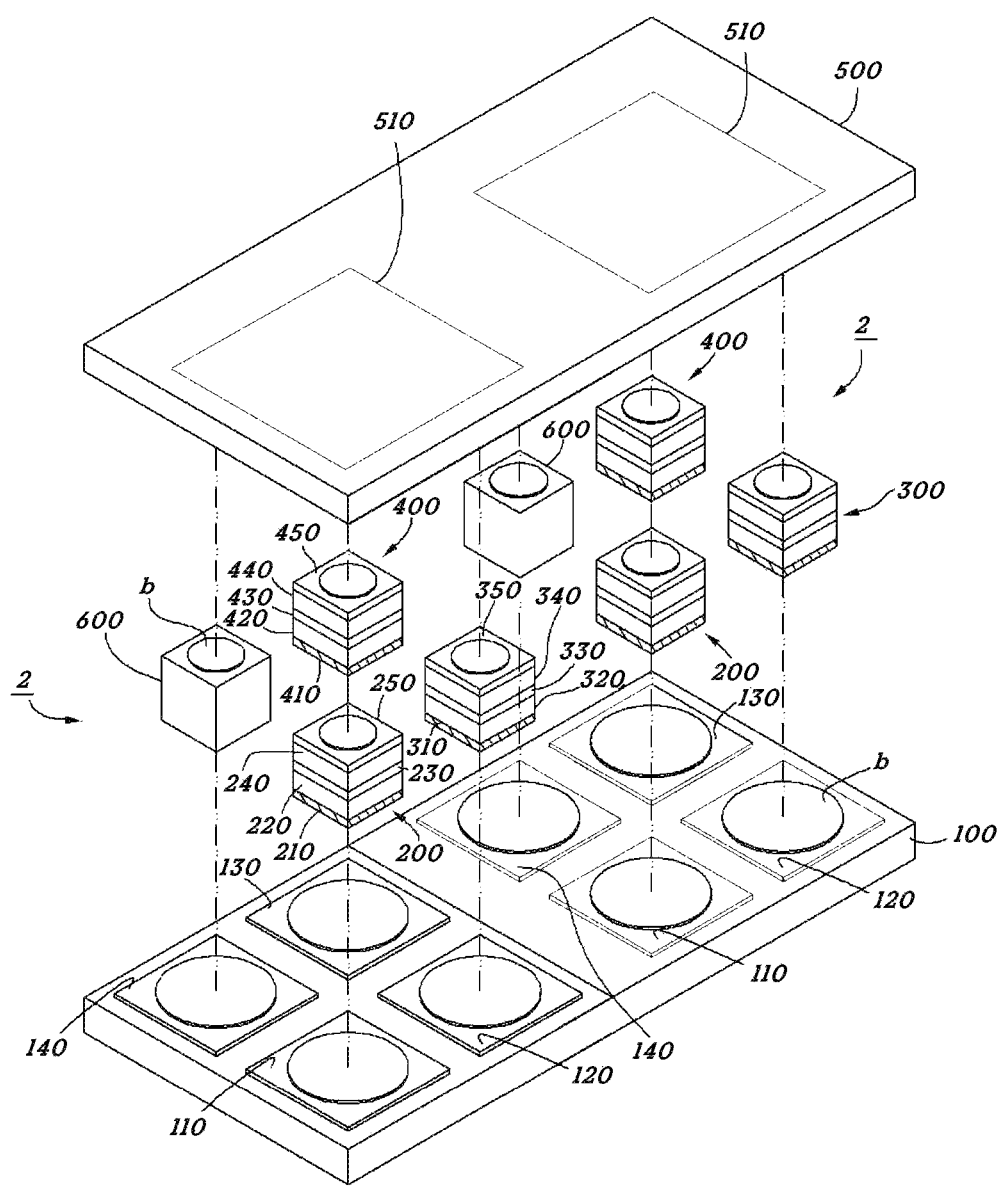
FIG. 5 is an exploded view specifically illustrating the LED display device of FIG. 4.
Figure 6:
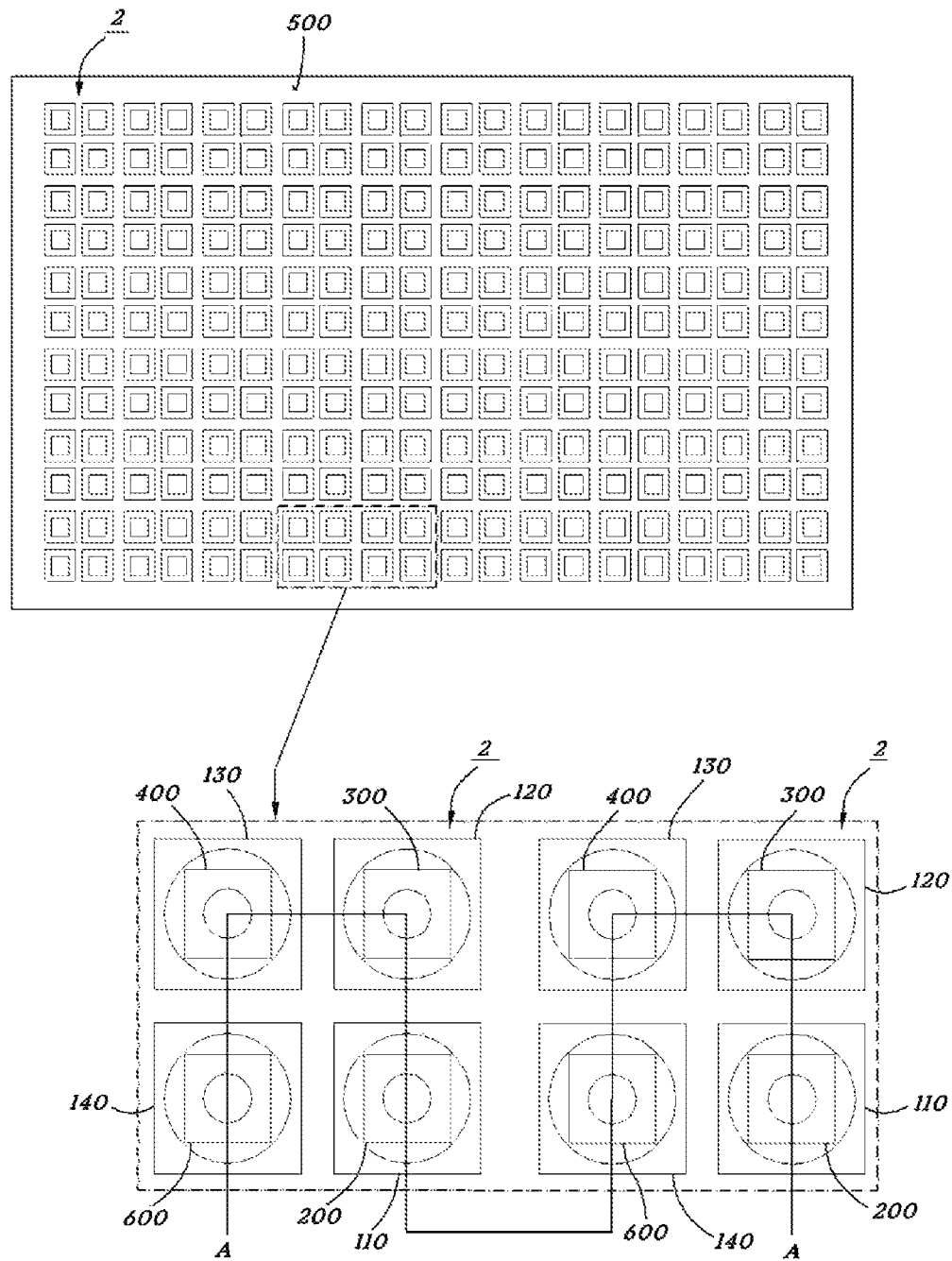
FIG. 6 illustrates the overall construction of an LED display device based on the pixel arrangement of FIG. 4.
Figure 7:
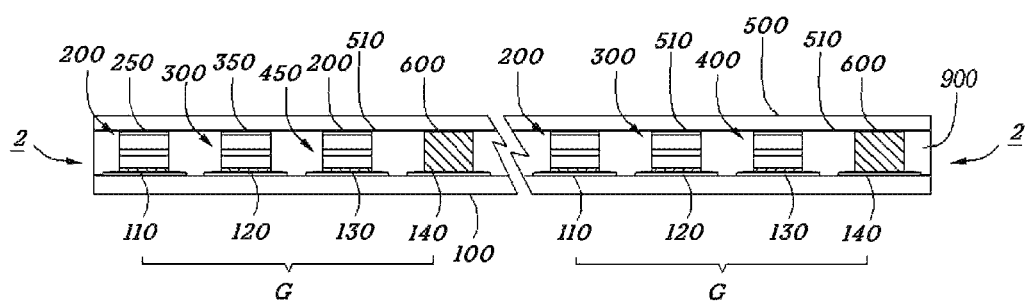
FIG. 7 is a cross-sectional view taken along line A-A of FIG. 6.
Figure 8:
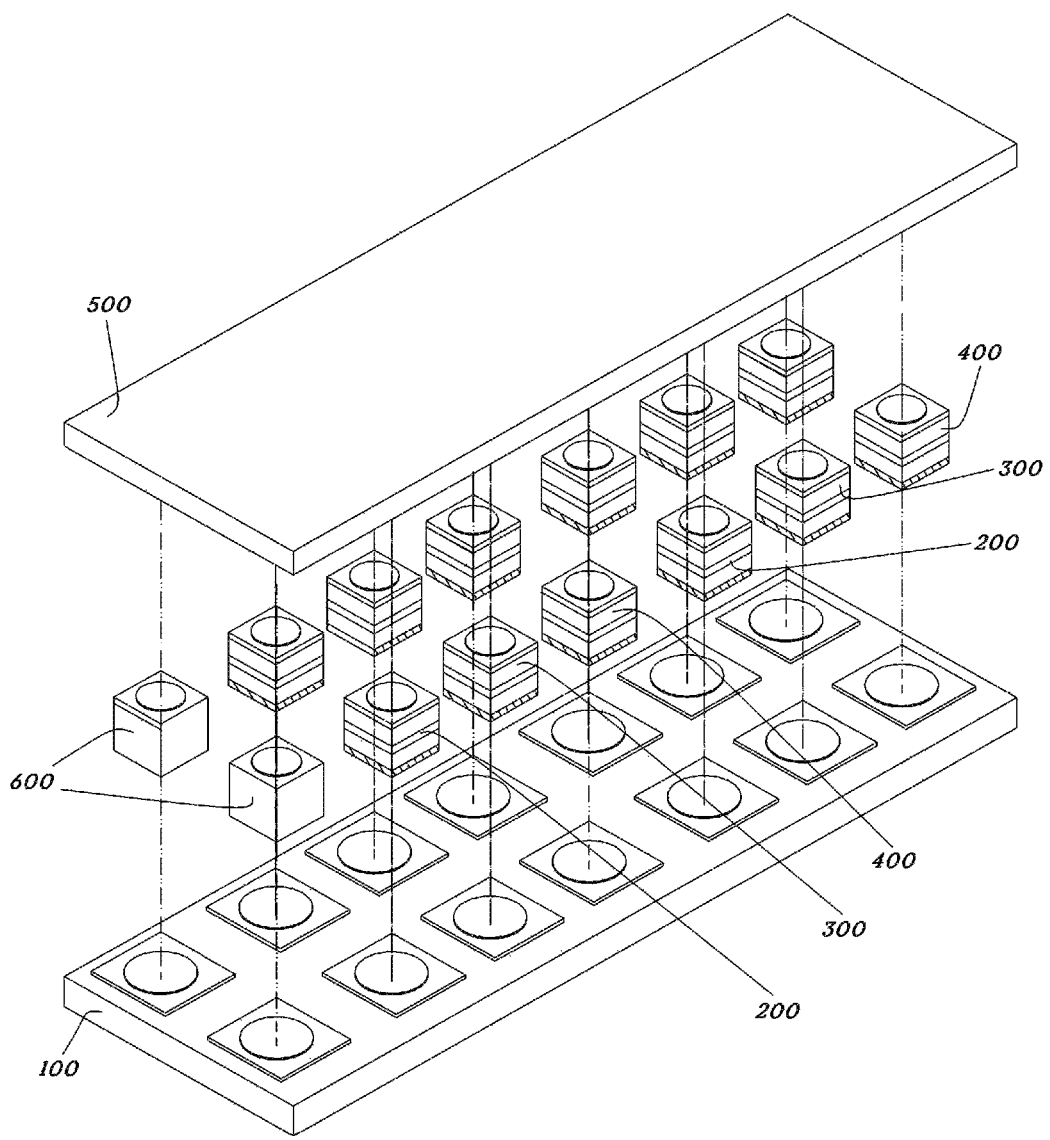
FIG. 8 is an alternative example of the LED display device of FIG. 1 in which each pixel includes three different types of LED chips (i.e. red, green, and blue light emitting LED chips) arrayed in a line and one conductor arranged outside an array of the LED chips.
Figure 9:
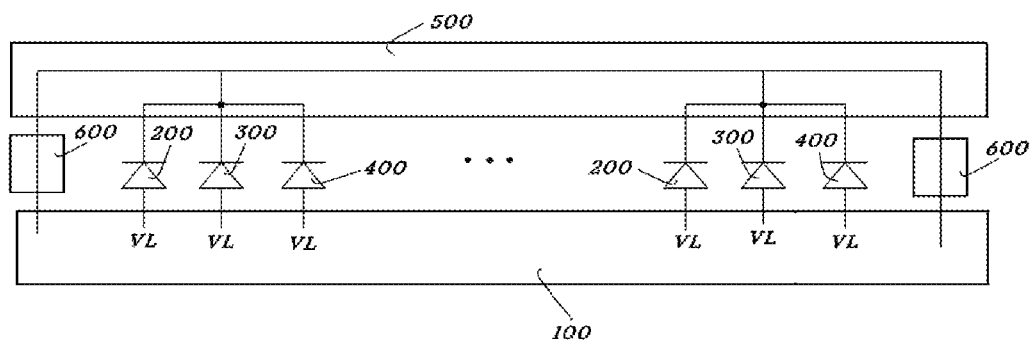
FIG. 9 is a schematic equivalent circuit diagram of an LED display device based on the pixel arrangement of FIG. 8.

FIG. 1 illustrates a vertical structure of an LED display device according to one embodiment of the present invention, FIG. 2 illustrates a horizontal structure of the LED display device of FIG. 1, FIG. 3 illustrates a time control printed board assembly (PBA) and a data line printed board assembly (PBA) in the LED display device of FIG. 1, FIG. 4 illustrates an example of the LED display device of FIG. 1 in which each pixel includes three different types of LED chips (i.e. red, green, and blue light emitting LED chips) and one conductor, FIG. 5 is an exploded view specifically illustrating the LED display device of FIG. 4, FIG. 6 illustrates the overall construction of an LED display device based on the pixel arrangement of FIG. 4, FIG. 7 is a cross-sectional view taken along line A-A of FIG. 6, FIG. 8 is an alternative example of the LED display device of FIG. 1 in which each pixel includes three different types of LED chips (i.e. red, green, and blue light emitting LED chips) arrayed in a line and one conductor arranged outside an array of the LED chips, and FIG. 9 is a schematic equivalent circuit diagram of an LED display device based on the pixel arrangement of FIG. 8.

Referring first to FIGS. 1 and 2, the LED display device includes a TFT substrate 100, LED chips 200, 300, and 400, a light transmitting plate 500, and a heat dissipating plate 700.

The TFT substrate 100 includes a plurality of LED driver units DU arrayed in a matrix. Each of the LED driver units DU includes a plurality of transistors. The LED driver units DU will be exemplified with reference to FIG. 16. The TFT substrate 100 includes electrode pads 110, 120, 130, and 140 (see FIG. 5) connected with first electrodes 210, 310, and 410 (see FIG. 5) to electrically connect the LED driver units DU and the corresponding LED chips. The connection relationship between the first electrodes and the electrode pads will be explained with reference to FIG. 5.

The LED chips 200, 300, and 400 are connected to the corresponding LED driver units DU. The LED chips 200, 300, and 400 are driven by the corresponding LED driver units DU to output light of different wavelengths. For example, the LED chips 200, 300, and 400 emit red, green, and blue light, respectively. The three LED chips 200, 300, and 400 are combined into one pixel. That is, the three LED chips 200, 300, and 400 are defined as R, G, and B sub-pixels constituting a basic pixel in a full-color LED display device. The LED driver units DU are elements for driving the corresponding sub-pixels. Only the left-most pixel and the right-most pixel are illustrated in FIG. 1. As exemplified in FIG. 6, the intervals between the neighboring pixels may be larger than those between the sub-pixels in each pixel. Each of the LED chips 200, 300, and 400 includes a first electrode 210, 310 or 410 (see FIG. 5) facing the TFT substrate 100 and a second electrode 250, 350 or 450 (see FIG. 5) facing the light transmitting plate 500. The connection relationships between the TFT substrate 100 and the first electrodes and between the light transmitting plate 500 and the second electrodes will be specifically exemplified with reference to FIG. 5.

The light transmitting plate 500 is attached to the upper portions of the LED chips 200, 300, and 400 to transmit light emitted from the LED chips 200, 300, and 400 therethrough. The upper portions of the LED chips 200, 300, and 400 are defined taking into consideration their locations in the figure and indicate the upper portions of the second electrodes (i.e. top electrodes) of the LED chips 200, 300, and 400. The light transmitting plate 500 includes light transmitting patterns 510 corresponding to the LED chips 200, 300, and 400. The light transmitting plate 500 is electrically connected to the second electrodes of the LED chips 200, 300, and 400 through the corresponding light transmitting patterns 510. The light transmitting plate 500 may include a patterned substrate 520 formed with the light transmitting electrode patterns 510, a polarizing film 530 attached to the upper surface of the patterned substrate, and a touch film 540 attached to the upper surface of the polarizing film 530, as illustrated in FIG. 1. Due to this structure, the light transmitting plate 500 can be used for a touch pad. The light transmitting plate 500 is often referred to as the patterned substrate 520 in the following description.

The heat dissipating plate 700 is an element for dissipating heat generated from the LED chips 200, 300, and 400 and is attached to the TFT substrate 100. The heat dissipating plate 700 is attached to the surface of the TFT substrate opposite to the surface to which the LED chips 200, 300, and 400 are attached. The heat dissipating plate 700 is made of a highly thermally conductive metal material for efficient heat dissipation. For example, the heat dissipating plate 700 may be made of aluminum (Al).

The TFT substrate 100 includes second electrode common lines CCL to which the second electrodes 250, 350, and 450 (see FIG. 5) of the LED chips 200, 300, and 400 are connected in common.

The LED display device includes conductors 600 located between the light transmitting plate 500 and the TFT substrate 100. The conductors 600 serve to electrically connect the second electrode common lines CCL and the second electrodes 250, 350, and 450 (see FIG. 5) of the LED chips 200, 300, and 400. The conductors 600 are directly connected to the second electrode common lines CCL and the second light transmitting electrode patterns 510. The conductors 600 may be located outside the arrays of the LED chips 200, 300, and 400, and the second electrode common lines CCL corresponding to the LED chips 200, 300, and 400 may be located outside the arrays of the LED driver units DU on the TFT substrate 100, as illustrated in FIG. 1. FIGS. 1, 2, and 8 exemplarily illustrate the locations of the conductors 600 outside the arrays of the LED chips 200, 300, and 400 and the locations of the second electrode common lines CCL outside the arrays of the LED driver units DU on the TFT substrate 100. Alternatively, the conductors 600 may be located between the light transmitting plate 500 and the TFT substrate 100 such that the second electrodes 250, 350, and 450 of the LED chips 200, 300, and 400 constituting the pixels are electrically connected to the TFT substrate 100, specifically the second electrode common lines CCL formed on the TFT substrate 100, as illustrated in FIGS. 4 to 7. The number of the conductors 600 may be the same as the number of the pixels, as exemplified in FIGS. 4 to 7. Although the second electrode common lines CCL corresponding to the conductors 600 and formed on the TFT substrate 100 are not specifically illustrated in FIGS. 4 to 7, the second electrode common lines CCL may be interconnected corresponding to the pixels on the arrays of the pixels other than being located outside the arrays of the LED driver units DU, unlike the second electrode common lines CCL illustrated in FIG. 2.

The interconnection lines on the TFT substrate 100 will be explained below with reference to FIG. 2. The TFT substrate 100 includes a plurality of voltage lines VL, a plurality of scan lines SL, and a plurality of data lines DL. Although one voltage line VL, one scan line SL, and one data line DL are illustrated for convenience in FIG. 2, these lines are interconnected corresponding to the numbers of rows and columns.

The voltage lines VL are interconnected in a first direction parallel to the second electrode common lines CCL on the LED driver units DU. The voltage lines VL supply an LED operating voltage to the LED chips 200, 300, and 400 through driving transistors DT (see FIG. 16) of the LED driver units DU connected thereto when the driving transistors DT are turned ON.

The scan lines SL are interconnected in a second direction crossing the direction in which the voltage lines VL are interconnected. The scan lines SL are connected with gate terminals of switching transistors ST (see FIG. 16) of the LED driver units DU connected thereto.

The data lines DL are interconnected parallel to the voltage lines VL in the first direction and are connected with drain terminals of the switching transistors ST (see FIG. 16) of the LED driver units DU connected thereto.

The plurality of voltage lines VL, the plurality of scan lines SL, and the plurality of data lines DL need to be electrically insulated from one another. For this electrical insulation, the LED driver units DU are formed in the TFT substrate 100, a first metal layer is formed thereon, the scan lines SL are interconnected on the first metal layer, a second metal layer is formed on and insulated from the first metal layer, and the voltage lines VL and the data lines DL are interconnected parallel to each other in the second metal layer. Alternatively, the voltage lines VL and the data lines DL are interconnected in the first metal layer and the scan lines SL are interconnected in the second metal layer formed on and insulated from the first metal layer. Alternatively, the scan lines SL, the voltage lines VL, and the data lines DL are interconnected in different metal layers. The numbers of the scan lines SL, the data lines DL, and the voltage lines VL may vary depending on the desired specifications (for example, size and resolution) of the LED display device.

A plurality of data driver ICs DDIC are arranged at one side of the TFT substrate 100. The data driver ICs DDIC are arranged in a line in the second direction in which the scan lines SL are interconnected. The data driver ICs DDIC are arranged corresponding to the data lines DL to provide switch signals to the data lines DL connected thereto in response to pixel control signals. When the switching transistors of the LED driver units DU are turned ON by the application of scan signals through the scan lines SL, the switch signals are transmitted to the drain terminals of the switching transistors through the data lines DL to control the driving transistors.

A plurality of line driver ICs LDIC are arranged in a line in the first direction at the other side of the TFT substrate 100. The scan lines SL are connected to the corresponding line driver ICs LDIC. Scan signals are provided to the gate terminals of the switching transistors of the LED driver units DU through the scan lines SL to control the switching transistors. As illustrated, each of the data driver ICs DDIC is attached to one side of the TFT substrate 100 and is connected with one end of the corresponding data line DL. Each of the line driver ICs LDIC is attached to the other side of the TFT substrate 100 and is connected with one end of the corresponding scan line SL. The data driver ICs DDIC and the line driver ICs LDIC may also be mounted on pads formed on the TFT substrate 100 where the driver ICs DDIC and LDIC are electrically connected with the interconnection lines. Alternatively, the data driver ICs DDIC and the line driver ICs LDIC may be assembled with global voltage lines GVL and GCCL to construct a printed board assembly, which is bonded to the TFT substrate.

The LED display device of the present invention further includes global voltage lines GVL, global second electrode common lines, and a time control unit 800. Each of the global voltage lines GVL is interconnected parallel to the array direction of the data driver ICs DDIC in the second direction at one side of the TFT substrate 100. The voltage lines VL interconnected in the first direction are connected in common to the global voltage lines GVL. The global second electrode common lines GCCL are interconnected parallel to the global voltage lines GVL in the second direction. The second electrode common lines CCL interconnected in the first direction are connected to the global second electrode common lines GCCL. As illustrated in FIG. 2, when the second electrode common lines GCCL are arranged at both sides of the TFT substrate 100 outside the arrays of the LED driver units DU, the second electrode common lines CCL at both sides of the TFT substrate 100 are connected in common to the global second electrode common lines GCCL. Alternatively, although not illustrated in this figure, the conductors 600 may be arranged in the individual pixels and second electrode common lines CCL corresponding to the conductors 600 may be interconnected in the first direction on the TFT substrate 100. In this case, all second electrode common lines CCL are connected in common to the global second electrode common lines GCCL. The global voltage lines GVL and the global second electrode common lines GCCL are connected to the time control unit 800. The time control unit 800 may be assembled with a scaler, a time control IC, and a memory to construct a printed board assembly, which is connected with the global voltage lines GVL and the global second electrode common lines GCCL.

The voltage lines VL and the second electrode common lines CCL may have linewidths of 20 μm. The global voltage lines GVL and the global second electrode common lines GCCL have broader linewidths than the voltage lines VL and the second electrode common lines CCL.

FIG. 3 illustrates the time control printed board assembly (PBA) and the data line printed board assembly (PBA) in the LED display device of FIG. 1. As illustrated in FIGS. 2 and 3, the data driver ICs DDIC, the global voltage line GVL, and the global second electrode common line GCCL can be appropriately arranged at one side of the TFT substrate 100 such that they do not interfere with one another.

With reference to FIGS. 4 to 7, a description will be given of an LED display device according to one embodiment of the present invention. Although the heat dissipating plate 700 illustrated in FIG. 1 is omitted for convenience in the vertical structure of FIGS. 4, 5, and 6, it can be conceived that the heat dissipating plate 700 is attached to the lower surface of the TFT substrate 100. Here, each of the LED chips 200, 300, and 400 is a vertical type LED in which a first electrode and a second electrode are disposed at lower and upper sides, respectively.

Specifically, the LED display device includes a TFT substrate 100, arrays of LED chips 200, 300, and 400, and a light transmitting plate 500, as illustrated in FIGS. 4 to 7. LED driver units DU (see FIG. 2) are formed in the TFT substrate 100 by a TFT process to individually control the LED chips 200, 300, and 400. The TFT substrate 100 has a rectangular shape in cross section. The light transmitting plate 500 has substantially the same shape and area as the TFT substrate and is spaced apart from the surface of the TFT substrate. The LED chips 200, 300, and 400 are located between the TFT substrate 100 and the light transmitting plate 500 and are arrayed in a matrix. The LED chips 200, 300, and 400 are combined into pixels, which are indicated by reference numeral 2 in FIGS. 4 to 7. That is, a plurality of pixels including the LED chips 200, 300, and 400 are arrayed in a matrix in the LED display device. The number and matrix array of the pixels determine the overall size of the LED display device, as illustrated in FIG. 6. Each pixel further includes a conductor 600. The three LED chips 200, 300, and 400 and the one conductor 600 are arranged in a quadrangular pattern, as illustrated in FIGS. 4 to 7.

The TFT substrate 100 includes a plurality of electrode pads 110, 120, 130, and 140 arrayed in a matrix corresponding to the plurality of pixels 2. The electrode pads 110, 120, 130, and 140 corresponding to each pixel 2 are defined as a pad group G (see FIG. 7) for convenience. The first electrode pad 110, the second electrode pad 120, and the third electrode pad 130 present in each pad group G are connected with first electrodes 210, 310, and 410 of the LED chips 200, 300, and 400, respectively, and the fourth electrode pad 140 present in each pad group G is connected with the conductor 600. The light transmitting plate 500 includes a plurality of light transmitting electrode patterns 510 for second electrodes formed corresponding to the pixels 2. The light transmitting electrode patterns 510 are formed by coating a conductive material such as indium tin oxide (ITO) on an insulating base material such as glass. The plurality of light transmitting electrode patterns 510 for second electrodes are arrayed so as not to be misaligned with the arrays of the plurality of pixels 2 and the arrays of the plurality of pad groups. The light transmitting plate 500 may be made of a plastic polymer material suitable for the manufacture of flexible displays. The material for the light transmitting plate 500 may be transparent or opaque.

Each of the first LED chips 200 is a red light emitting gallium arsenide or gallium phosphide semiconductor chip and includes a second electrode 250 and a first electrode 210. The first LED chip 200 includes a p-type semiconductor layer 220, an active layer 230, and an n-type semiconductor layer 240 formed in this order between the second electrode 250 and the first electrode 210 from the first electrode 210 toward the second electrode 250.

Each of the second LED chips 300 is a green light emitting gallium nitride semiconductor chip and includes a second electrode 350 and a first electrode 310. The second LED chip 300 includes a p-type semiconductor layer 320, an active layer 330, and an n-type semiconductor layer 340 formed in this order between the second electrode 350 and the first electrode 310 from the first electrode 310 toward the second electrode 350. Each of the third LED chips 400 is a blue light emitting gallium nitride semiconductor chip and includes a second electrode 450 and a first electrode 410. The third LED chip 400 includes a p-type semiconductor layer 420, an active layer 430, and an n-type semiconductor layer 440 formed in this order between the second electrode 450 and the first electrode 410 from the first electrode 410 toward the second electrode 450.

The second electrodes 250, 350, and 450 as top electrodes may be transparent electrodes such as ITO electrodes. The first electrodes 210, 310, and 410 as bottom electrodes may be metal electrodes. The second electrodes 250, 350, and 450 and the first electrodes 210, 310, and 410 are optional and may be omitted. In this case, semiconductor layers or ohmic contact layers serve as top or bottom electrodes of the corresponding LED chips.

In this embodiment, the first electrodes 210, 310, and 410 of the first LED chips 200, the second LED chips 300, and the third LED chips 400 have a p-type polarity because they are connected to the p-type semiconductor layers 220, 320, and 420, respectively, and the second electrodes 250, 350, and 450 of the first LED chips 200, the second LED chips 300, and the third LED chips 400 have an n-type polarity because they are connected to the n-type semiconductor layers 240, 340, and 440, respectively.

On the other hand, the first LED chips 200 are mounted on the TFT substrate 100 such that the first electrodes 210 are connected to the first electrode pads 110, the second LED chips 300 are mounted on the TFT substrate 100 such that the first electrodes 310 are connected to the second electrode pads 120, and the third LED chips 400 are mounted on the TFT substrate 100 such that the first electrodes 410 are connected to the third electrode pads 130. A conductive adhesive b may be used to attach the first electrodes 210, 310, and 410 of the first LED chips 200, the second LED chips 300, and the third LED chips 400 to the electrode pads 110, 120, and 130, respectively.

The conductors 600 are made of a sufficiently stiff material. The conductors 600 are connected to the fourth electrode pads 140 of the pad groups and stand vertically on the TFT substrate 100 between the TFT substrate 100 and the light transmitting plate 500. The same conductive adhesive b can be used to attach the conductors 600 to the fourth electrode pads 140.

The light transmitting electrode patterns 510 for the second electrodes are arranged at intervals from each other. The light transmitting plate 500 is placed on and bonded to the upper portions of the first LED chips 200, the second LED chips 300, and the third LED chips 400 and the upper ends of the conductors 600 such that the second electrodes 250 of the first LED chips 200, the second electrodes 350 of the second LED chips 300, the second electrodes 450 of the third LED chips 400, and the upper ends of the conductors 600 are connected to the corresponding light transmitting electrode patterns 510 for the second electrodes. The same conductive adhesive b can be used to place/attach the light transmitting plate 500 on/to the upper portions of the LED chips 200, 300, and 400 and the upper ends of the conductors 600.

The light transmitting electrode patterns 510 formed in the light transmitting plate 500 are connected to the second electrodes 250 of the first LED chips 200, the second electrodes 350 of the second LED chips 300, the second electrodes 450 of the third LED chips 400, and the upper ends of the conductors 600. Thus, the first electrode pads 110, the second electrode pads 120, and the third electrode pads 130 serve as individual electrode pads for driving the first LED chips 200, the second LED chips 300, and the third LED chips 400, respectively, and the fourth electrode pads 140 serve as common electrode pads, enabling individual control over the first LED chips 200, the second LED chips 300, and the third LED chips 400. This individual control over the first LED chips 200, the second LED chips 300, and the third LED chips 400 allows the pixel units 2 to emit light of various colors, achieving full-color display.

Under this construction, the intervals between the first LED chips 200 and the second LED chips 300 are the same as the intervals between the second LED chips 300 and the third LED chips 400, which is preferred for high color uniformity of light emitted from the pixels 2. An electrically insulating underfill 900 (see FIG. 4) may be filled between the TFT substrate 100 and the light transmitting plate 500 to protect the first LED chips 200, the second LED chips 300, and the third LED chips 400 from the external environment. For high color conversion efficiency, all sides of the LED chips 200, 300, and 400 are surrounded by a molding material. The molding material may be black or white in color.

Referring next to FIG. 8, a description will be given of an LED display device according to another embodiment of the present invention. FIG. 8 illustrates only a portion of the display device, specifically only two pixels located at the left side of the display device. In the previous embodiment of the LED display device illustrated in FIGS. 4 to 7, each pixel 2 includes three LED chips 200, 300, and 400 and one conductor 600 to form a square shape. In contrast, in the embodiment of FIG. 8, conductors 600 are arranged outside arrays of LED chips 200, 300, and 400 and each pixel includes three LED chips 200, 300, and 400 arranged in a line.

The cross-section of a state in which a TFT substrate 100, LED chips 200, 300, and 400, conductors 600, and a light transmitting plate 500 are assembled into the display device may be the same as that illustrated in FIG. 1. The heat dissipating plate 700 illustrated in FIG. 1 is omitted for convenience in FIG. 8 but it can be conceived that a heat dissipating plate 700 is attached to the lower surface of the TFT substrate 100. The TFT substrate 100 may be made of glass. Alternatively, the TFT substrate 100 may be made of a plastic polymer material suitable for the manufacture of flexible displays. The material for the TFT substrate 100 may transparent or opaque.

The first LED chips 200, the second LED chips 300, and the third LED chips 400 are mounted on first electrode pads 110, second electrode pads 120, and third electrode pads 130 disposed in lines in the TFT substrate 100, respectively. The electrode pads 110, 120, and 130 are formed at locations corresponding to the LED chips 200, 300, and 400, respectively. The attachment of the LED chips 200, 300, and 400 to the electrode pads 110, 120, and 130, respectively, is substantially the same as that described in FIGS. 4 to 7. The conductors 600 are attached to the fourth electrode pads 140.

FIG. 9 is a schematic equivalent circuit diagram of an LED display device based on the pixel arrangement of FIG. 8. With reference to FIG. 9 together with FIG. 1, electrical connections in the LED display device will be explained.

The LED chips 200, 300, and 400 in each pixel are controlled by corresponding LED driver units DU (FIG. 1) connected thereto. For light emission, power is supplied to the LED chips 200, 300, and 400 through voltage lines VL connected to the corresponding LED chips 200, 300, and 400. Assuming that the top electrodes (second electrodes) and bottom electrodes (first electrodes) of the LED chips 200, 300, and 400 illustrated in FIG. 1 are cathodes and anodes, respectively, power is directed upward, as illustrated in FIG. 9. The conductors 600 are connected to the TFT substrate 100 through the cathode terminals of the LED chips 200, 300, and 400. The conductors 600 are connected with the cathode terminals of the LED chips 200, 300, and 400 through the light transmitting electrode patterns 510 (see FIG. 5) formed in the light transmitting plate 500 and are connected to the second electrode common lines CCL (see FIG. 2) formed in the TFT substrate 100.

Each of the LED chips 200, 300, and 400 described in this embodiment is of a vertical type. With reference to FIGS. 10 to 14, a description will be given of one embodiment in which flip-type LED chips 200, 300, and 400 are combined into pixels.

Figure 10:
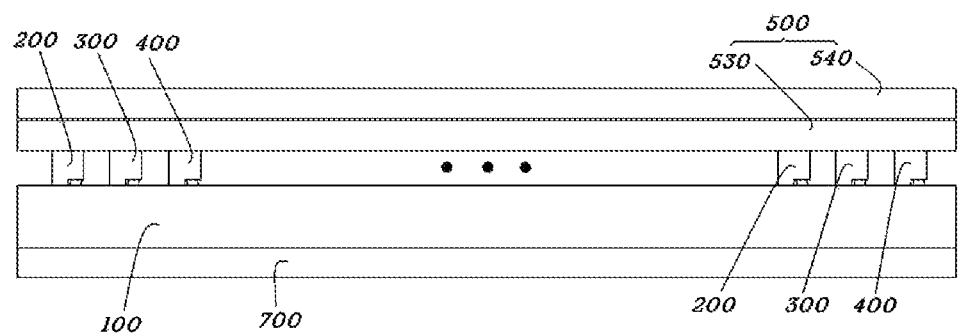
FIG. 10 illustrates a vertical structure of an LED display device according to a further embodiment of the present invention.
Figure 11:
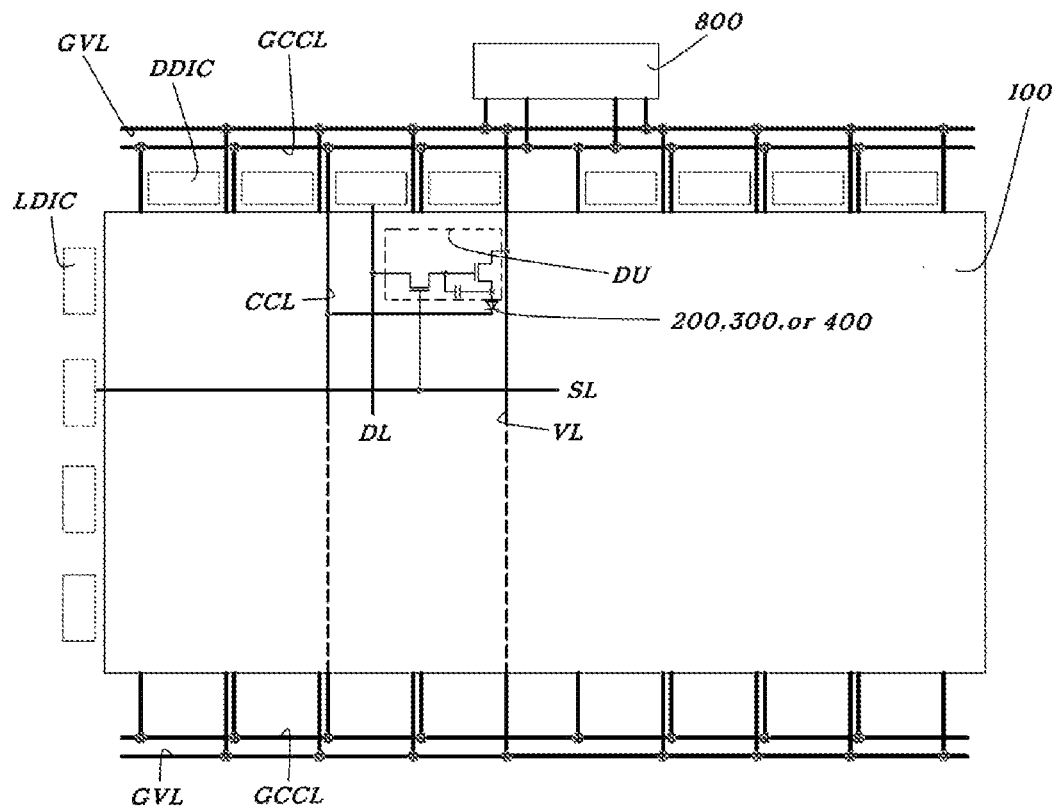
FIG. 11 illustrates a horizontal structure of the LED display device of FIG. 10.
Figure 12:
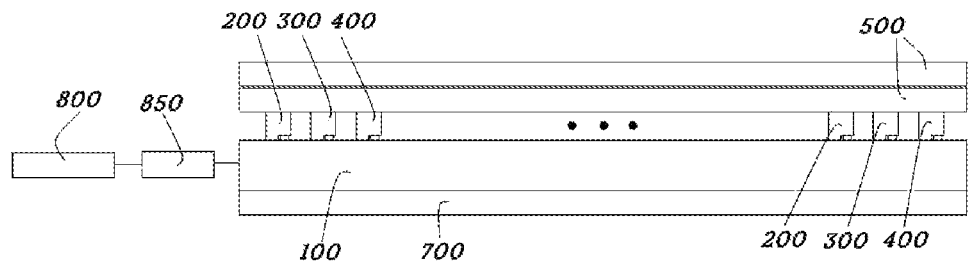
FIG. 12 illustrates a time control PBA and a data line PBA in the LED display device of FIG. 10.
Figure 13:
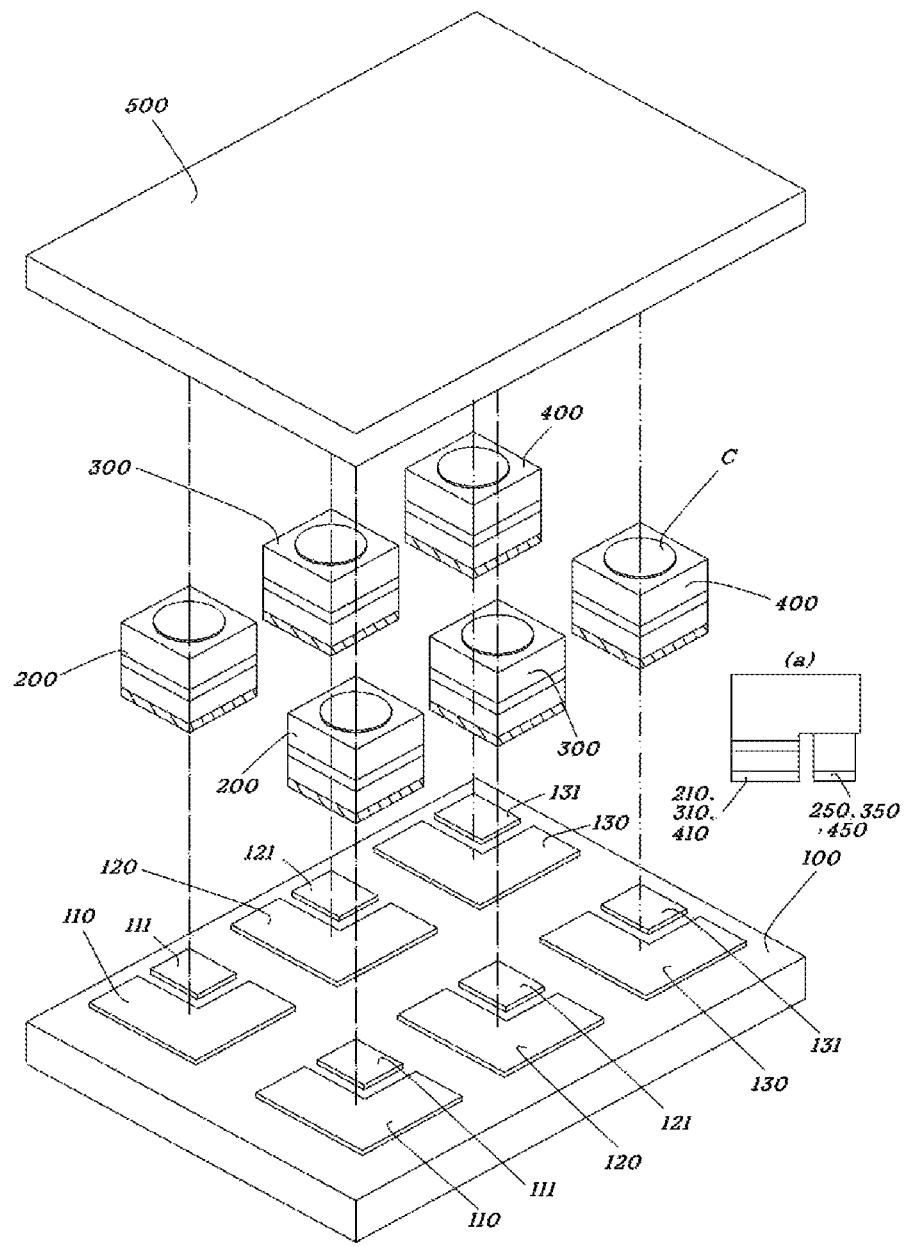
FIG. 13 is an example of the LED display device of FIG. 10 in which each pixel includes three different types of LED chips (i.e. red, green, and blue light emitting LED chips) arrayed in a line.
Figure 14:
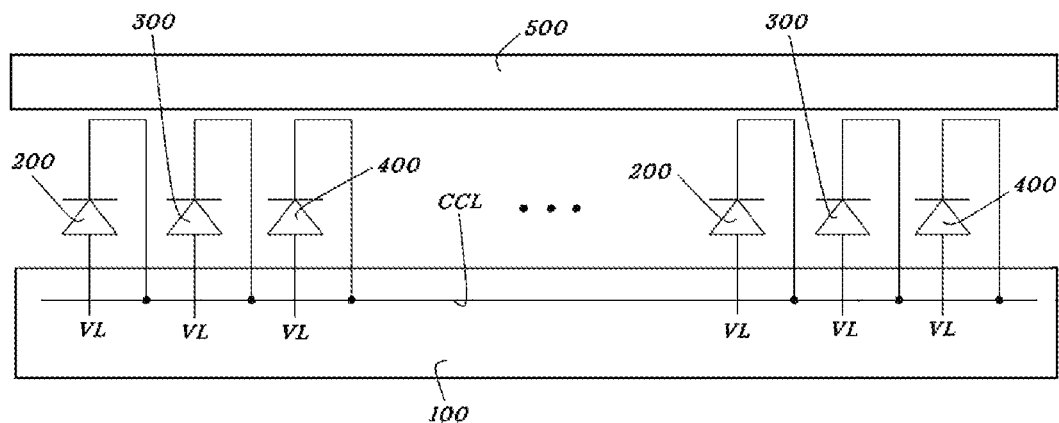
FIG. 14 is a schematic equivalent circuit diagram of an LED display device based on the pixel arrangement of FIG. 13.

FIG. 10 illustrates a vertical structure of an LED display device according to a further embodiment of the present invention, FIG. 11 illustrates a horizontal structure of the LED display device of FIG. 10, FIG. 12 illustrates a time control PBA and a data line PBA in the LED display device of FIG. 10, FIG. 13 is an example of the LED display device of FIG. 10 in which each pixel includes three different types of LED chips (i.e. red, green, and blue light emitting LED chips) arrayed in a line, and FIG. 14 is a schematic equivalent circuit diagram of an LED display device based on the pixel arrangement of FIG. 13.

Referring first to FIGS. 10 and 11, the LED display device includes: a TFT substrate including a plurality of LED driver units DU arrayed in a matrix, each of the LED driver units including a plurality of transistors; LED chips 200, 300, and 400 attached to and driven by the corresponding LED driver units DU; a light transmitting plate 500 attached to the upper portions of the LED chips 200, 300, and 400 and through which light emitted from the LED chips 200, 300, and 400 is transmitted; and a heat dissipating plate 700 attached to the TFT substrate 100 to dissipate heat generated from the LED chips 200, 300, and 400.

In this embodiment, the LED chips 200, 300, and 400 are flip chips and are combined into pixels. Each of the LED chips includes a first electrode and a second electrode facing the TFT substrate 100. When the LED chips 200, 300, and 400 are mounted on the TFT substrate 100, the first electrodes and the second electrodes of the LED chips 200, 300, and 400 are electrically connected to the TFT substrate 100 through electrode pads 110, 120, and 130 for the first electrodes and electrode pads 111, 121, and 131 for the second electrodes disposed in the TFT substrate 100, respectively.

The electrode pads 110, 120, and 130 are connected with the first electrodes 210, 310, and 410 (see FIG. 13) to electrically connect the LED driver units DU and the corresponding LED chips 200, 300, and 400. The electrode pads 111, 121, and 131 are connected with the second electrodes 250, 350, and 450 (see FIG. 13) to electrically connect the LED driver units DU and the corresponding LED chips 200, 300, and 400. The LED chips 200, 300, and 400 are combined to form pixels. The connection relationship between the first and second electrodes of the LED chips 200, 300, and 400 and the corresponding electrode pads will be explained in more detail with reference to FIG. 13.

The light transmitting plate 500 may include a polarizing film 530 attached to the upper portions of the LED chips 200, 300, and 400 and a touch film 540 attached to the upper surface of the polarizing film 530. The flip-type LED chips 200, 300, and 400 are distinguished from the vertical type LED chips in that the polarizing film 530 and the touch film 540 are sequentially attached onto the arrays of the LED chips 200, 300, and 400 using an adhesive without the need for the patterned substrate 520 (FIG. 1) formed with the light transmitting electrode patterns in the light transmitting plate 500.

The TFT substrate 100 includes a plurality of voltage lines VL, a plurality of scan lines SL, and a plurality of data lines DL. Although one voltage line VL, one scan line SL, and one data line DL are illustrated for convenience in FIG. 11, these lines are interconnected corresponding to the numbers of rows and columns.

The voltage lines VL are interconnected in a first direction parallel to second electrode common lines CCL on the LED driver units DU. The voltage lines VL supply an LED operating voltage to the LED chips 200, 300, and 400 through driving transistors DT (see FIG. 16) of the LED driver units DU connected thereto when the driving transistors DT are turned ON.

The scan lines SL are interconnected in a second direction crossing the direction in which the voltage lines VL are interconnected. The scan lines SL are connected with gate terminals of switching transistors ST (see FIG. 16) of the LED driver units DU connected thereto.

The data lines DL are interconnected parallel to the voltage lines VL in the first direction and are connected with drain terminals of the switching transistors ST (see FIG. 16) of the LED driver units DU connected thereto.

The plurality of voltage lines VL, the plurality of scan lines SL, and the plurality of data lines DL need to be electrically insulated from one another. For this electrical insulation, the LED driver units DU are formed in the TFT substrate 100, a first metal layer is formed thereon, the scan lines SL are interconnected on the first metal layer, a second metal layer is formed on and insulated from the first metal layer, and the voltage lines VL and the data lines DL are interconnected parallel to each other in the second metal layer. Alternatively, the voltage lines VL and the data lines DL are interconnected in the first metal layer and the scan lines SL are interconnected in the second metal layer formed on and insulated from the first metal layer. Alternatively, the scan lines SL, the voltage lines VL, and the data lines DL are interconnected in different metal layers. The numbers of the scan lines SL, the data lines DL, and the voltage lines VL may vary depending on the desired specifications (for example, size and resolution) of the LED display device.

A plurality of data driver ICs DDIC are arranged at one side of the TFT substrate 100. The data driver ICs DDIC are arranged in a line in the second direction in which the scan lines SL are interconnected. The data driver ICs DDIC are arranged corresponding to the data lines DL to provide switch signals to the data lines DL connected thereto in response to pixel control signals. When the switching transistors of the LED driver units DU are turned ON by the application of scan signals through the scan lines SL, the switch signals are transmitted to the drain terminals of the switching transistors through the data lines DL to control the driving transistors.

A plurality of line driver ICs LDIC are arranged in a line in the first direction at the other side of the TFT substrate 100. The scan lines SL are connected to the corresponding line driver ICs LDIC. Scan signals are provided to the gate terminals of the switching transistors of the LED driver units DU through the scan lines SL to control the switching transistors. As illustrated, each of the data driver ICs DDIC is attached to one side of the TFT substrate 100 and is connected with one end of the corresponding data line DL. Each of the line driver ICs LDIC is attached to the other side of the TFT substrate 100 and is connected with one end of the corresponding scan line SL. Alternatively, the data driver ICs DDIC and the line driver ICs LDIC may be assembled with global voltage lines GVL and GCCL to construct a printed board assembly, which is bonded to the TFT substrate.

The TFT substrate 100 includes a plurality of second electrode common lines CCL arranged parallel to the plurality of voltage lines VL in the first direction. The electrode pads 250, 350, and 450 connected with the second electrodes of the LED chips 200, 300, and 400 corresponding to the plurality of LED driver units DU connected to one voltage line VL are connected in common to the second electrode common lines CCL. That is, assuming that the second electrodes of the LED chips 200, 300, and 400 are cathode terminals, the second electrode common lines CCL are current paths downstream of the cathode terminals of the LED chips 200, 300, and 400. The second electrode common lines CCL are interconnected in the same number as the voltage lines VL.

The LED display device further includes global voltage lines GVL, global second electrode common lines, and a time control unit 800. Each of the global voltage lines GVL is interconnected parallel to the array direction of the data driver ICs DDIC in the second direction at one side of the TFT substrate 100. The voltage lines VL interconnected in the first direction are connected in common to the global voltage lines GVL. The global second electrode common lines GCCL are interconnected parallel to the global voltage lines GVL in the second direction. The second electrode common lines CCL interconnected in the first direction are connected to the global second electrode common lines GCCL. The global voltage lines GVL and the global second electrode common lines GCCL are connected to the time control unit 800. The time control unit 800 may be assembled with a scaler, a time control IC, and a memory to construct a printed board assembly, which is connected to the global voltage lines GVL and the global second electrode common lines GCCL.

In this embodiment, the voltage lines VL and the second electrode common lines CCL may have linewidths of 20 μm. The global voltage lines GVL and the global second electrode common lines GCCL have broader linewidths than the voltage lines VL and the second electrode common lines CCL.

FIG. 12 illustrates the time control printed board assembly (PBA) and the data line printed board assembly (PBA) in the LED display device of FIG. 10. As illustrated in FIGS. 11 and 12, the data driver ICs DDIC, the global voltage line GVL, and the global second electrode common line GCCL can be appropriately arranged at one side of the TFT substrate 100 such that they do not interfere with one another.

Next, an example of the LED display device of FIGS. 10 to 12 will be explained with reference to FIG. 13. The LED display device includes a TFT substrate 100, flip-type LED chips 200, 300, and 400, and a light transmitting plate 500. The LED driver units DU are formed in the TFT substrate 100 by a TFT process. The TFT substrate 100 has a rectangular shape in cross section. The light transmitting plate 500 has substantially the same shape and area as the TFT substrate and is spaced apart from the surface of the TFT substrate. The LED chips 200, 300, and 400 are located between the TFT substrate 100 and the light transmitting plate 500 and are arrayed in a matrix. The LED chips 200, 300, and 400 are combined into pixels. That is, a plurality of pixels including the LED chips 200, 300, and 400 are arrayed in a matrix. The number and matrix array of the pixels determine the overall size of the LED display device.

The TFT substrate 100 includes a plurality of electrode pads 110, 120, 130, 111, 121, and 131 arrayed in a matrix corresponding to the pixels 2. Reference numerals 110, 120, and 130 are electrode pads for first electrodes and reference numerals 111, 121, and 131 are electrode pads for second electrodes. The electrode pads 110, 120, and 130 are connected with first electrodes of the LED chips 200, 300, and 400. The electrode patterns 111, 121, and 131 are connected with second electrodes of the LED chips 200, 300, and 400. The light transmitting plate 500 is bonded to the upper portions of the LED chips 200, 300, and 400 using an adhesive.

(a) of FIG. 13 is a longitudinal cross-sectional view of the LED chip 200, 300 or 400.

Each of the first LED chips 200 is a red light emitting gallium arsenide semiconductor chip and includes a second electrode 250 and a first electrode 210. The first LED chip 200 includes a p-type semiconductor layer 220, an active layer 230, and an n-type semiconductor layer 240 formed in this order between the second electrode 250 and the first electrode 210 from the first electrode 210 toward the second electrode 250.

Each of the second LED chips 300 is a green light emitting gallium nitride semiconductor chip and includes a second electrode 350 and a first electrode 310. The second LED chip 300 includes a p-type semiconductor layer 320, an active layer 330, and an n-type semiconductor layer 340 formed in this order between the second electrode 350 and the first electrode 310 from the first electrode 310 toward the second electrode 350.

Each of the third LED chips 400 is a blue light emitting gallium nitride semiconductor chip and includes a second electrode 450 and a first electrode 410. The third LED chip 400 includes a p-type semiconductor layer 420, an active layer 430, and an n-type semiconductor layer 440 formed in this order between the second electrode 450 and the first electrode 410 from the first electrode 410 toward the second electrode 450.

In this embodiment, the first electrodes 210, 310, and 410 of the first LED chips 200, the second LED chips 300, and the third LED chips 400 have a p-type polarity because they are connected to the p-type semiconductor layers 220, 320, and 420, respectively, and the second electrodes 250, 350, and 450 of the first LED chips 200, the second LED chips 300, and the third LED chips 400 have an n-type polarity because they are connected to the n-type semiconductor layers 240, 340, and 440, respectively.

On the other hand, the first LED chips 200 are mounted on the TFT substrate 100 such that the first electrodes 210 are connected to the first electrode pads 110, the second LED chips 300 are mounted on the TFT substrate 100 such that the first electrodes 310 are connected to the second electrode pads 120, and the third LED chips 400 are mounted on the TFT substrate 100 such that the first electrodes 410 are connected to the third electrode pads 130. A conductive adhesive (not illustrated) may be used to attach the first electrodes 210, 310, and 410 of the first LED chips 200, the second LED chips 300, and the third LED chips 400 to the electrode pads 110, 120, and 130, respectively, similarly to the previous embodiment using the vertical type LED chips.

The second electrodes 250, 350, and 450 of the LED chips 200, 300, and 400 are mounted on the electrode patterns 111, 121, and 131, respectively. As described with reference to FIG. 11, the electrode patterns 111, 121, and 131 are connected in common to second electrode common lines CCL.

Under this construction, the intervals between the first LED chips 200 and the second LED chips 300 are the same as the intervals between the second LED chips 300 and the third LED chips 400, which is preferred for high color uniformity of light emitted from the pixels 2. An electrically insulating underfill (not illustrated) may be filled between the TFT substrate 100 and the light transmitting plate 500 to protect the first LED chips 200, the second LED chips 300, and the third LED chips 400 from the external environment. For high color conversion efficiency, all sides of the LED chips 200, 300, and 400 are surrounded by a molding material. The molding material may be black or white in color. The foregoing embodiments exemplify that three different types of LED chips, i.e. a red LED, a green LED, and a blue LED, in each pixel emit light in red, green, and blue wavelength regions, respectively. Alternatively, blue or UV LED chips and a color conversion sheet or a phosphor may be used to achieve light emission in red, green, and blue wavelength regions.

FIG. 14 is a schematic equivalent circuit diagram of an LED display device corresponding to FIGS. 10 to 13. Referring to FIG. 14 together with FIGS. 10 to 13, LED chips 200, 300, and 400 in each pixel are controlled by corresponding LED driver units DU connected thereto. For light emission, power is supplied to the LED chips 200, 300, and 400 through voltage lines VL connected to the LED chips 200, 300, and 400. Assuming that second electrodes and first electrodes of the LED chips 200, 300, and 400 are cathode terminals and anode terminals, respectively, power is directed upward, as illustrated in FIG. 14. The cathode terminals of the LED chips connected to one voltage line VL may be connected in common to one second electrode common line CCL.

Figure 15:
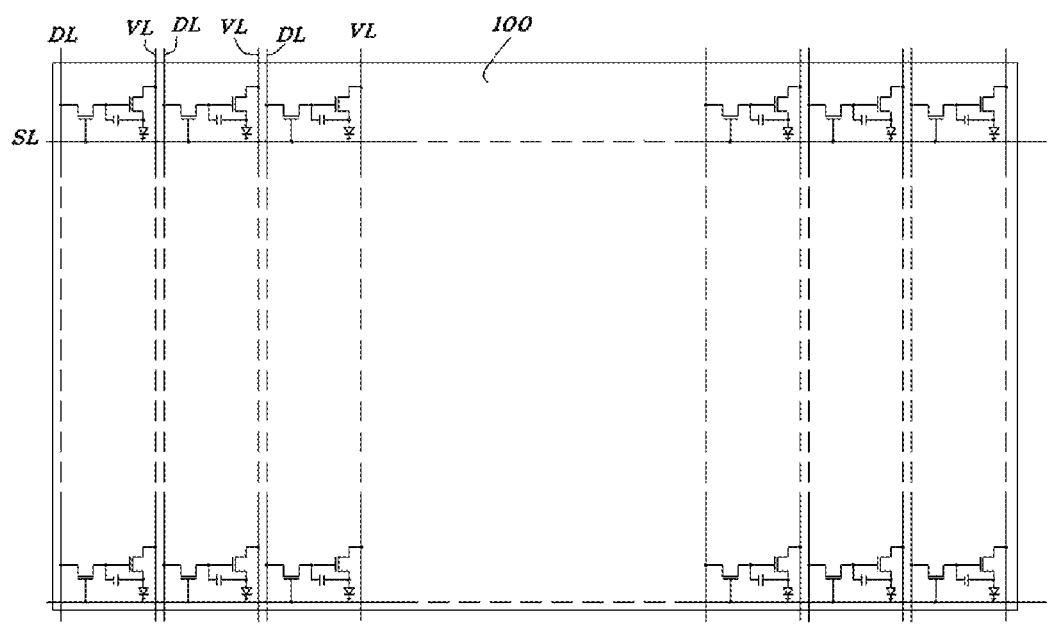
FIG. 15 illustrates the overall interconnection arrangement of an LED display device according to one embodiment of the present invention in which data lines DL, scan lines SL, and LED driver units DU located in areas defined by the data lines and the scan lines crossing each other.

FIG. 15 illustrates the overall interconnection arrangement of an LED display device according to one embodiment of the present invention. Referring to FIG. 15, LED driver units are arrayed in a matrix by a TFT process and scan lines SL, data lines DL, and voltage lines VL are interconnected thereon. In this arrangement, one LED driver unit is located at an intersection between one data line DL and one scan line SL. LED chips are connected to the LED driver units in a one-to-one relationship. The data lines DL and the voltage lines VL are interconnected in parallel with each other in a first direction and the scan lines SL are interconnected in a second direction crossing the first direction. As mentioned earlier, the data lines DL, the voltage lines VL, and the scan lines SL need to be electrically insulated from one another. Thus, these lines should be appropriately insulated from one another and interconnected in the same layer. Alternatively, these lines should be insulated from one another and interconnected in different vertical layer structures. Although not illustrated in FIG. 15, second electrode common lines CCL (see FIG. 2 or FIG. 11) are interconnected in the first direction.

Figure 16:
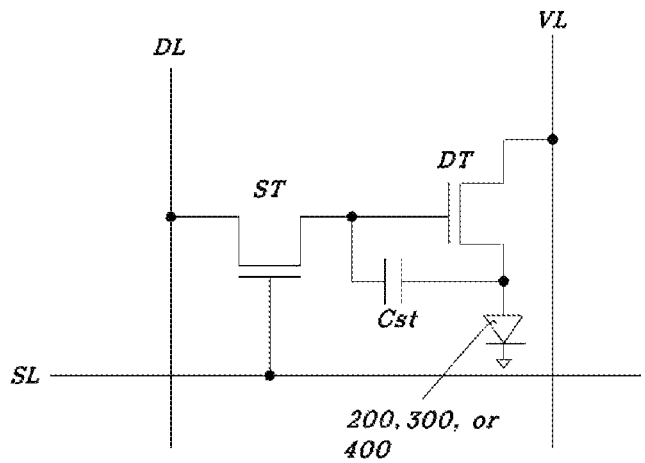
FIG. 16 is an equivalent circuit diagram of one LED driver unit DU formed on a TFT substrate.

FIG. 16 is an equivalent circuit diagram of an LED driver unit DU of an LED display device according to one embodiment of the present invention. Referring to FIG. 16, the LED driver unit DU has a 2T1C structure consisting of a switching transistor ST, a driving transistor DT, and a storage capacitor Cst.

A gate terminal of the switching transistor ST is connected to one scan line SL, a drain terminal of the switching transistor ST is connected to one data line DL, and a source terminal of the switching transistor ST is connected to a gate terminal of the driving transistor DT.

The gate terminal of the driving transistor DT is connected to the source terminal of the switching transistor ST, a drain terminal of the driving transistor DT is connected to one voltage line VL, and a source terminal of the driving transistor DT is connected to a first electrode (anode terminal) of a corresponding LED chip.

One end of the storage capacitor Cst is connected between the source terminal of the switching transistor ST and the gate terminal of the driving transistor DT. The other end of the storage capacitor Cst is connected to the first electrode (anode terminal) of the LED chip. As a result, the storage capacitor Cst is connected between the gate terminal and the source terminal of the driving transistors DT.

The first electrode (anode terminal) of the LED chip is connected to the source terminal of the driving transistor DT and a second electrode (cathode terminal) of the LED chip is grounded. As can be seen from FIG. 2 or 11, the second electrode of the LED chip is connected to a second electrode common line CCL. Particularly, in the embodiment of FIG. 2, the second electrode of the LED chip is connected to the second electrode common line CCL through a conductor 600.

In this structure, the switching transistor ST is controllably turned ON or OFF in response to scan signals provided through the scan line SL. In a state in which the switching transistor ST is turned ON, the driving transistor DT is controlled in response to data signals provided through the data line DL such that an LED operating voltage is provided to the LED chip connected to the source terminal of the driving transistor DT. At this time, the storage capacitor Cst serves to maintain the voltage at a predetermined level such that a constant level of the LED operating voltage is provided to the LED chip in response to the data signals.

Figure 17:
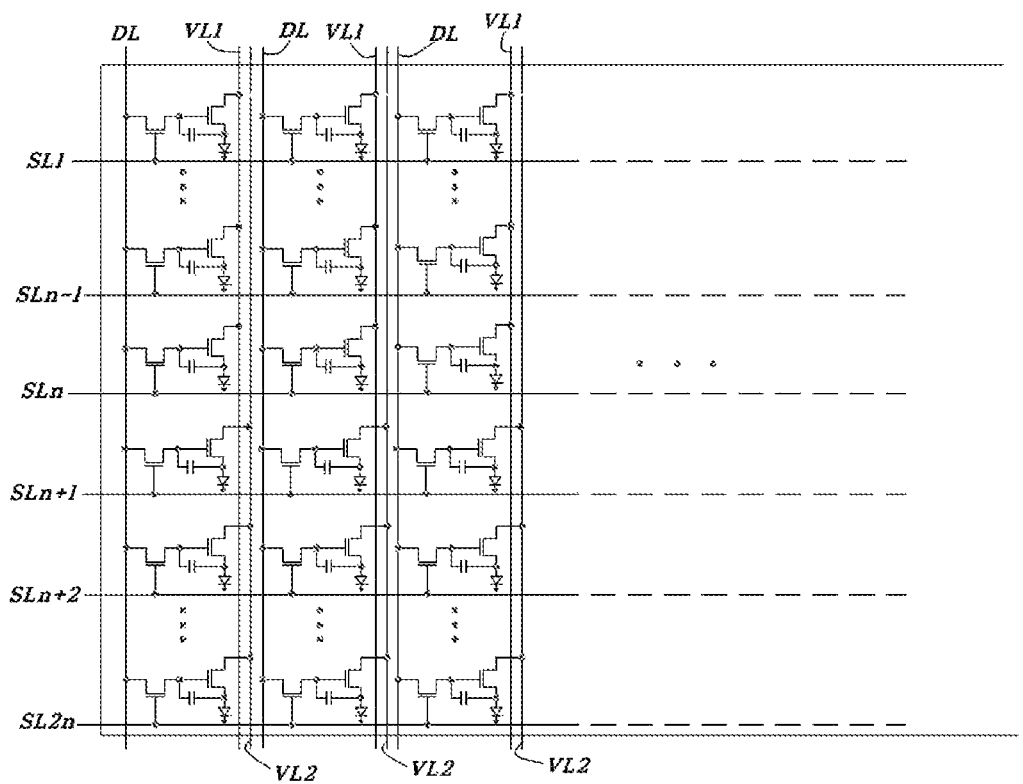
FIG. 17 illustrates an LED display device according to another embodiment of the present invention in which voltage lines are interconnected in voltage line pairs, each of which includes a first voltage line and a second voltage line.

FIG. 17 illustrates the overall interconnection arrangement of an LED display device according to another embodiment of the present invention. Referring to FIG. 17, voltage line pairs, each including a first voltage line VL1 and a second voltage line VL2, are interconnected, unlike in the interconnection arrangement illustrated in FIG. 15.

For ultra high definition (UHD), since the number of pixels is 3840*2160 (the number of sub-pixels is ((3840*2160)*3), the number of scan lines interconnected in a second direction is 2160. In the interconnection arrangement illustrated in FIG. 15, the number of the pixels (or sub-pixels) connected to one voltage line VL is a total of 2160. When an LED operating voltage is provided through only one voltage line VL, a voltage drop issue occurs, which will be briefly discussed with reference to FIG. 18.

Figure 18:
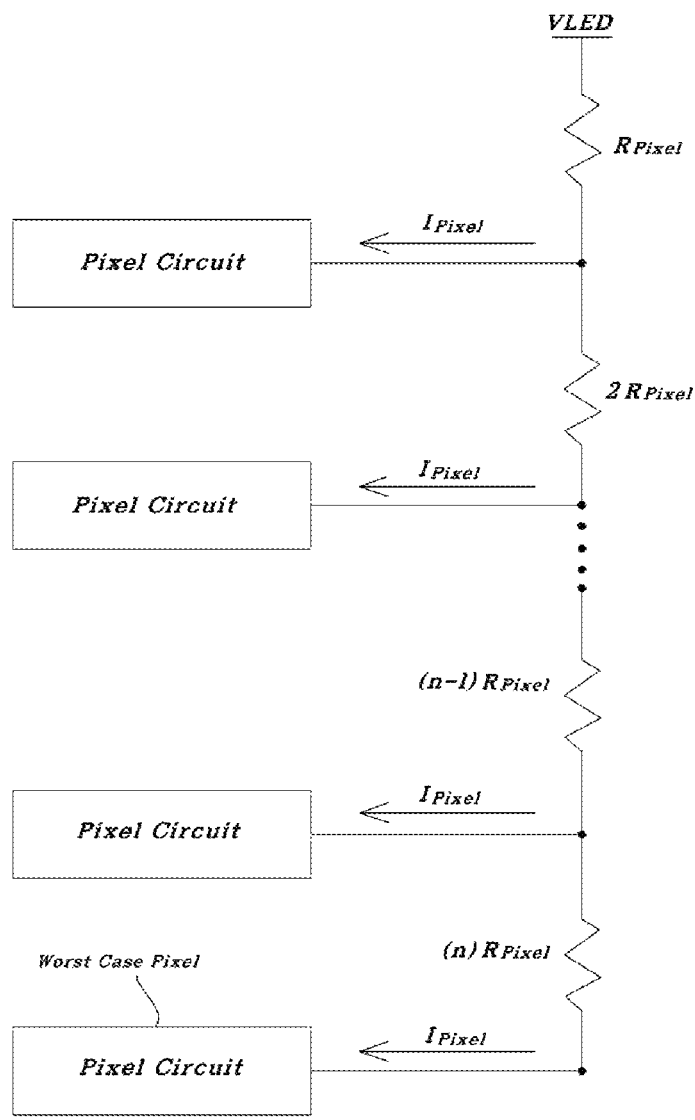
FIG. 18 illustrates a voltage drop issue that is taken into consideration when voltage lines are interconnected in an LED display device according to one embodiment of the present invention.

As illustrated in FIG. 18, assuming that the number of pixels connected to one voltage line is n and considering that a voltage drop is caused by parasitic resistance in the data lines and the pixels, the total voltage drop, $V_{drop}$, can be expressed by Equation 1:

$$V_{drop} = I_{pixel} * R_{pixel} + I_{pixel} * 2R_{pixel} + \ldots + I_{pixel} * (n-1)R_{pixel} + \quad (1)$$

$$I_{pixel} * (n)R_{pixel}$$

$$= I_{pixel} * R_{pixel}(1 + 2 + \ldots + (n-1) + (n))$$

$$= I_{pixel} * R_{pixel}(n(n+1)/2)$$

As can be seen from Equation 1, the total voltage drop, $V_{drop}$, in one voltage line connected with the n pixels is $I_{pixel}*R_{pixel}(n(n+1)/2)$, a dropped voltage is applied to the downstream pixel, and the highest LED operating voltage drop ($I_{pixel}*(n)R_{pixel}$) is recorded in the last pixel. Therefore, the LED chips in the last row pixel (the worst case pixel) show weak light output or have difficulty in outputting normal colors.

This voltage drop issue can be solved by interconnecting voltage line pairs, each of which includes a first voltage line VL1 and a second voltage line VL2, as illustrated in FIG. 17.

As illustrated in FIG. 17, 2n scan lines SL are divided in half. The 2n scan lines are interconnected such that LED driver units connected to the first scan line SL1, . . . , and LED driver units connected to the $n^{th}$ scan line SLn are connected to the first voltage lines VL1 through which a voltage is supplied to the corresponding LED driver units and LED driver units connected to the $(n+1)^{th}$ scan line SLn+1, . . . , and LED driver units connected to the $2n^{th}$ scan line SL2n are connected to the second voltage lines VL2 through which a voltage is supplied to the corresponding LED driver units. As such, when the number of pixels connected to one voltage line is reduced to half, a voltage drop issue caused by parasitic resistance in the LED driver units connected to one voltage line and the data lines can be solved to some extent.

Figure 19:
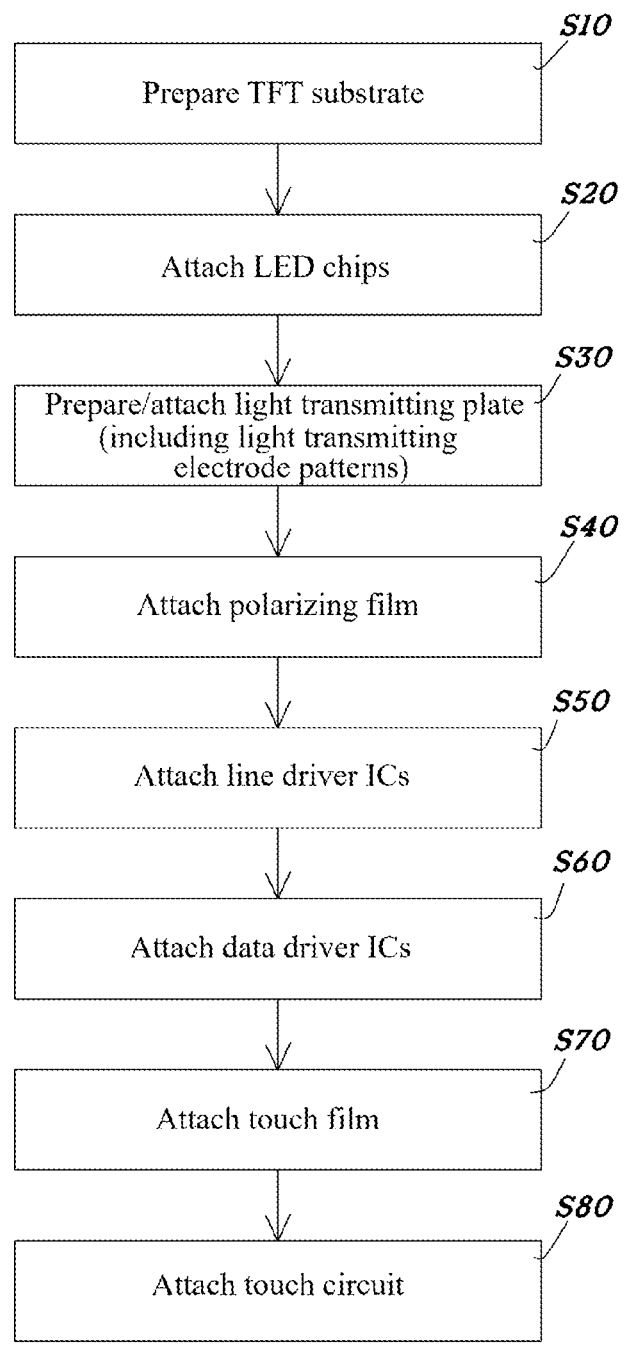
FIG. 19 is a block diagram illustrating the overall procedure for fabricating an LED display device according to one embodiment of the present invention.

FIG. 19 is a block diagram illustrating the overall procedure for fabricating an LED display device according to one embodiment of the present invention. With reference to FIG. 19, first, a TFT substrate is prepared by a thin film transistor (TFT) production process (S10). In the TFT substrate prepared in S10, various types of lines, including data lines, voltage lines, scan lines, and second electrode common lines, are interconnected are formed. Electrode pads are also disposed on which constituent LED chips of pixels are to be mounted. Then, LED chips are attached onto the TFT substrate (S20). In S20, conductors for electrical connection with second electrode common lines are also attached onto the TFT substrate. Then, a light transmitting plate including light transmitting electrode patterns for second electrodes is attached to the upper portions of the LED chips (S30). Although the presence of a polarizing film and a touch film in the light transmitting plate is described in the foregoing embodiments, the light transmitting plate prepared in S30 refers to a patterned substrate. Thereafter, a polarizing film is attached to the upper surface of the patterned substrate (S40). Then, line driver ICs LDIC are attached (S50) and data driver ICs DDIC are attached (S60). Then, a touch film is attached to the upper surface of the polarizing film (S70). Finally, a touch circuit is attached (S80).

While various embodiments of the present invention have been described above, it should be noted that the scope of the present invention is not limited to the embodiments and is defined by the claims that follows.

What is claimed is:

1. An LED display device comprising:
a TFT substrate comprising a plurality of LED driver units arrayed in a matrix, each of the LED driver units comprising a plurality of transistors;
LED chips attached to and driven by the corresponding LED driver units;
a light transmitting plate attached to the upper portions of the LED chips and through which light emitted from the LED chips is transmitted;
a heat dissipating plate attached to the TFT substrate to dissipate heat generated from the LED chips;
global voltage lines interconnected at one side of the TFT substrate;
global second electrode common lines interconnected parallel to the global voltage lines; and
a time control unit connected with the global voltage lines and the global second electrode common lines,
wherein each of the LED chips is a flip chip in which a first electrode and a second electrode face the TFT substrate,
wherein the TFT substrate comprises a plurality of voltage lines interconnected in a first direction on the LED driver units, a plurality of scan lines electrically insulated from the voltage lines and interconnected in a second direction crossing the first direction, and a plurality of data lines electrically insulated from the voltage lines and the scan lines and interconnected parallel to the voltage lines in the first direction,
wherein the TFT substrate comprises a plurality of second electrode common lines interconnected parallel to the plurality of voltage lines in the first direction,
wherein the second electrode common lines are connected in common to the electrode pads connected with the second electrodes of the LED chips corresponding to the plurality of LED driver units connected to each of the voltage lines,
wherein each of the global voltage lines is interconnected in the second direction, and the voltage lines are connected to the global voltage lines in common, and
wherein the global second electrode common lines are interconnected parallel in the second direction, and the second electrode common lines are connected to the global second electrode common lines in common.

2. The LED display device according to claim 1, wherein the TFT substrate comprises electrode pads connected with the first electrodes of the LED chips and electrode pads connected with the second electrodes of the LED chips such that the LED driver units are electrically connected with the corresponding LED chips.

3. The LED display device according to claim 1, wherein the light transmitting plate comprises a polarizing film attached to the upper portions of the LED chips and a touch film attached to the upper surface of the polarizing film.

4. The LED display device according to claim 1, wherein the second electrode common lines and the voltage lines have linewidths of 20 µm.

5. An LED display device comprising:
a TFT substrate comprising a plurality of LED driver units arrayed in a matrix, each of the LED driver units comprising a plurality of transistors;
LED chips attached to and driven by the corresponding LED driver units;
a light transmitting plate attached to the upper portions of the LED chips and through which light emitted from the LED chips is transmitted; and
a heat dissipating plate attached to the TFT substrate to dissipate heat generated from the LED chips,
wherein each of the LED chips is a flip chip in which a first electrode and a second electrode face the TFT substrate,
wherein the TFT substrate comprises a plurality of voltage lines interconnected in a first direction on the LED driver units, a plurality of scan lines electrically insulated from the voltage lines and interconnected in a second direction crossing the first direction, and a plurality of data lines electrically insulated from the voltage lines and the scan lines and interconnected parallel to the voltage lines in the first direction, and
wherein the voltage lines comprise voltage line pairs, each of which comprises a first voltage line and a second voltage line, and when the number of the scan lines is 2n, an LED operating voltage is supplied to the LED driver unit connected to the first scan line to the LED driver unit connected to the $n^{th}$ scan line through the first voltage line and an LED operating voltage is supplied to the LED driver unit connected to the $(n+1)^{th}$ scan line to the LED driver unit connected to the $2n^{th}$ scan line through the second voltage line.

6. The LED display device according to claim 5, wherein the TFT substrate comprises electrode pads connected with the first electrodes of the LED chips and electrode pads connected with the second electrodes of the LED chips such that the LED driver units are electrically connected with the corresponding LED chips.

7. The LED display device according to claim 5, wherein the light transmitting plate comprises a polarizing film attached to the upper portions of the LED chips and a touch film attached to the upper surface of the polarizing film.

8. The LED display device according to claim 5, wherein the TFT substrate comprises a plurality of second electrode common lines interconnected parallel to the plurality of voltage lines in the first direction, and the second electrode common lines and the voltage lines have linewidths of 20 µm.

* * * * *